United States Patent
Kawai et al.

(10) Patent No.: US 9,716,107 B2
(45) Date of Patent: Jul. 25, 2017

(54) COMPOSITE SUBSTRATE

(71) Applicant: SHIN-ETSU CHEMICAL CO., LTD., Tokyo (JP)

(72) Inventors: Makoto Kawai, Annaka (JP); Shigeru Konishi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/120,458

(22) PCT Filed: Feb. 16, 2015

(86) PCT No.: PCT/JP2015/054085
§ 371 (c)(1),
(2) Date: Aug. 19, 2016

(87) PCT Pub. No.: WO2015/125722
PCT Pub. Date: Aug. 27, 2015

(65) Prior Publication Data
US 2017/0077141 A1    Mar. 16, 2017

(30) Foreign Application Priority Data
Feb. 21, 2014    (JP) .................... 2014-031461

(51) Int. Cl.
*H01L 27/12* (2006.01)
*H01L 21/84* (2006.01)
(Continued)

(52) U.S. Cl.
CPC ............ *H01L 27/1203* (2013.01); *B32B 9/04* (2013.01); *B32B 37/025* (2013.01); *C30B 29/06* (2013.01);
(Continued)

(58) Field of Classification Search
None
See application file for complete search history.

(56) References Cited

U.S. PATENT DOCUMENTS 6,391,812 B1    5/2002  Araki et al.
6,497,763 B2 *  12/2002 Kub .................... H01L 21/2007
                                                             117/915
(Continued)

FOREIGN PATENT DOCUMENTS

JP      9-64168 A       3/1997
JP      2001-064080 A   3/2001
(Continued)

OTHER PUBLICATIONS

International Search Report dated May 19, 2015, issued in counterpart International Application No. PCT/JP2015/054085 (2 pages).
(Continued)

*Primary Examiner* — Minh-Loan Tran
(74) *Attorney, Agent, or Firm* — Westerman, Hattori, Daniels & Adrian, LLP

(57) ABSTRACT

This composite substrate has a single-crystal semiconductor thin film (13) provided to at least the front surface of an inorganic insulating sintered-body substrate (11) having a thermal conductivity of at least 5 W/m·K and a volume resistivity of at least $1 \times 10^8$ Ω·cm. The composite substrate also has, provided between the inorganic insulating sintered-body substrate (11) and the single-crystal semiconductor thin film (13), a silicon coating layer (12) comprising polycrystalline silicon or amorphous silicon.
As a result of the present invention, metal impurity contamination from the sintered body can be inhibited, even in a composite substrate in which a single-crystal silicon thin film is provided upon an inexpensive ceramic sintered body which is opaque with respect to visible light, which exhibits
(Continued)

an excellent thermal conductivity, and which further exhibits little loss at a high frequency range, and characteristics can be improved.

7 Claims, 4 Drawing Sheets

(51) Int. Cl.
    *H01L 21/762* (2006.01)
    *C30B 29/06* (2006.01)
    *C30B 33/06* (2006.01)
    *B32B 9/04* (2006.01)
    *B32B 37/00* (2006.01)
    *H01L 21/768* (2006.01)
    *H01L 29/66* (2006.01)
    *H01L 29/78* (2006.01)

(52) U.S. Cl.
    CPC ........ *C30B 33/06* (2013.01); *H01L 21/76254* (2013.01); *H01L 21/76841* (2013.01); *H01L 21/76846* (2013.01); *H01L 21/84* (2013.01); *H01L 29/66772* (2013.01); *H01L 29/7812* (2013.01); *B32B 2255/20* (2013.01); *B32B 2307/206* (2013.01); *B32B 2313/00* (2013.01); *B32B 2315/02* (2013.01); *B32B 2315/08* (2013.01); *B32B 2457/14* (2013.01)

(56) References Cited

U.S. PATENT DOCUMENTS

| | | | |
|---|---|---|---|
| 2008/0087891 A1* | 4/2008 | Sung | ................... H01L 21/0237 257/43 |
| 2010/0193900 A1 | 8/2010 | Ohmi et al. | |
| 2014/0327116 A1 | 11/2014 | Konishi et al. | |
| 2015/0155299 A1* | 6/2015 | Kitada | .............. H01L 29/78603 428/448 |

FOREIGN PATENT DOCUMENTS

| | | |
|---|---|---|
| JP | 2010-278160 A | 12/2010 |
| JP | 2013-232465 A | 11/2013 |
| WO | 2009/011152 A1 | 1/2009 |
| WO | 2013/094665 A1 | 4/2015 |

OTHER PUBLICATIONS

Office Action dated Feb. 28, 2017, issued in counterpart Japanese Application No. 2016-504083 (5 pages).

* cited by examiner

COMPOSITE SUBSTRATE

TECHNICAL FIELD

This invention relates to a composite substrate for the fabrication of primarily high-frequency semiconductor devices, which substrate is obtained by forming a silicon thin-film on the surface of a sintered-body substrate of silicon nitride, aluminum nitride or the like having a high heat conductivity.

BACKGROUND ART

In recent years, the performance of silicon-based semiconductor devices has steadily increased as the design rule has become smaller. As a result, heat dissipation from individual transistors and metal lines connecting between transistors has become a problem. Solutions that have emerged to address this problem include thinning the back side of the silicon substrate to a thickness of about one hundred to several hundred microns following device fabrication and mounting a giant fan over the chip to promote heat dissipation or running water-cooling tubes around the device.

However, even when the silicon is thinned, the region where devices are fabricated only extends to a depth of about several microns from the surface and regions other than this act as heat reservoirs; hence, the efficiency from the standpoint of heat dissipation actually worsens. Lately, silicon-on-insulator (SOI) wafers and the like used in devices such as high-performance processors have a structure wherein an insulating layer of $SiO_2$ is situated immediately below the device active layer. But $SiO_2$ has a low thermal conductivity of 1.38 W/m·k, making this approach highly problematic from the standpoint of heat dissipation. In addition, silicon substrates, owing to their dielectric properties, undergo a large power loss in the high-frequency region, and so there are limitations to their use.

Silicon on sapphire (SOS), which uses a sapphire substrate, is noteworthy because it has a good heat conductivity and a small power loss in the high-frequency range. However, one drawback is that, because the sapphire substrate is transparent in the visible light region, it does not respond to optical sensors used for verifying the presence or absence of the substrate and for wafer positioning in device fabrication processes. Another problem is the high cost of the sapphire substrate. In addition, the difference in coefficient of thermal expansion relative to silicon is large, and so warpage tends to arise during heat treatment of the composite substrate and film formation, making it difficult to achieve larger wafer diameters.

Examples of inexpensive substrates which are opaque to visible light and have good heat conductivity include ceramic sintered bodies made of silicon nitride, aluminum nitride or the like. However, because these substrates are obtained by cementing a silicon nitride or aluminum nitride powder with a sintering aid, metallic impurities such as iron and aluminum included in the powder, or the sintering aid itself (e.g., alumina), become causes of contamination in the device fabrication processes, making the use of such substrates difficult.

Prior technical literature relating to the invention includes WO 2013/094665 (Patent Document 1).

PRIOR ART DOCUMENT

Patent Document

Patent Document 1: WO 2013/094665

SUMMARY OF THE INVENTION

Problems to be Solved by the Invention

In light of the above circumstances, the object of this invention is to provide a composite substrate obtained by providing a single-crystal silicon thin-film on a ceramic sintered body that is opaque to visible light and has good heat conductivity, and that moreover has a low power loss in the high-frequency region and is also inexpensive, which composite substrate is able to suppress contamination by metallic impurities from the sintered body and enhance device characteristics.

Means for Solving the Problems

As a result of extensive investigations, the inventors have discovered that the above object is effectively achieved by using a composite substrate which includes an inorganic insulating sintered-body substrate having a thermal conductivity of at least 5 W/m·k and a volume resistivity of at least $1 \times 10^8$ Ω·cm, a single-crystal semiconductor thin-film on at least the front surface of the inorganic insulating sintered-body substrate, and a silicon coating of polycrystalline silicon or amorphous silicon interposed between the inorganic insulating sintered-body substrate and the single-crystal semiconductor thin-film.

Accordingly, the invention provides the following composite substrate.

[1] A composite substrate comprising an inorganic insulating sintered-body substrate having a thermal conductivity of at least 5 W/m·k and a volume resistivity of at least $1 \times 10^8$ Ω·cm, and a single-crystal semiconductor thin-film provided on at least a front surface of the inorganic insulating sintered-body substrate, the composite substrate being characterized by having a silicon coating made of polycrystalline silicon or amorphous silicon provided between the inorganic insulating sintered-body substrate and the single-crystal semiconductor thin-film.

[2] The composite substrate of [1] which is characterized in that the silicon coating covers all of the inorganic insulating sintered-body substrate.

[3] The composite substrate of [1] or [2] which is characterized in that the silicon coating is a high-purity silicon formed by sputtering, electron-beam vapor deposition, chemical vapor deposition or epitaxial growth.

[4] The composite substrate of any one of [1] to [3] which is characterized in that the inorganic insulating sintered-body substrate is composed primarily of silicon nitride, aluminum nitride or sialon.

[5] The composite substrate of any one of [1] to [4] which is characterized in that the single-crystal semiconductor thin-film is single-crystal silicon.

[6] The composite substrate of any one of [1] to [5] which is characterized by further comprising, between the inorganic insulating sintered-body substrate and the silicon coating, a silicon nitride coating formed by chemical vapor deposition.

[7] The composite substrate of any one of [1] to [6] which is characterized by further comprising, between the silicon coating and the single-crystal semiconductor thin-film, at least one intermediate insulating layer made of a material selected from the group consisting of silicon oxide, silicon nitride, aluminum nitride and sialon.

Advantageous Effects of the Invention

By using an inorganic insulating sintered body that is opaque to visible light and has good heat conductivity, and that moreover has a low power loss in the high-frequency region and is also inexpensive, the invention is able to provide an inexpensive composite substrate in which contamination by metallic impurities has been suppressed.

BRIEF DESCRIPTION OF THE DIAGRAM

EMBODIMENT FOR CARRYING OUT THE INVENTION

Figure 1:
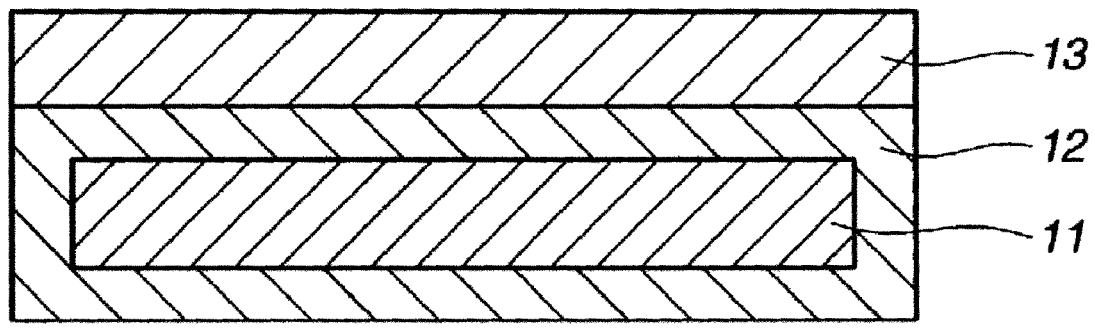
FIG. 1 is a schematic cross-sectional diagram showing an example of the construction of the composite substrate according to the invention.

Embodiments of the composite substrate of the invention are described below.

The composite substrate according to the invention includes an inorganic insulating sintered-body substrate having a thermal conductivity of at least 5 W/m·k and a volume resistivity of at least $1 \times 10^8$ Ω·cm, and a single-crystal semiconductor thin-film provided on at least a front surface of the inorganic insulating sintered-body substrate, the composite substrate being characterized by having a silicon coating made of polycrystalline silicon or amorphous silicon provided between the inorganic insulating sintered-body substrate and the single-crystal semiconductor thin-film.

Here, the inorganic insulating sintered body used as the substrate has a thermal conductivity that is preferably higher than 1.5 W/m·k (the thermal conductivity of $SiO_2$), more preferably at least 5 W/m·k, and even more preferably at least 10 W/m·k. The upper limit is not particularly limited, but is generally not more than 2,500 W/m·k, and especially not more than 2,000 W/m·k.

To suppress a loss in power due to the dielectric characteristics, it is desirable for the substrate to have as high as volume resistivity as possible, with a value of at least $1 \times 10^8$ Ω·cm being preferred, and a value of at least $1 \times 10^{10}$ Ω·cm being more preferred. There is no particular upper limit, although the volume resistivity is generally not more than $1 \times 10^{18}$ Ω·cm, and especially not more than $1 \times 10^{16}$ Ω·cm.

Examples of inorganic insulating sintered bodies that satisfy these conditions include sintered bodies composed primarily of silicon nitride, aluminum nitride, sialon ($Si_3N_4 \cdot Al_2O_3$) or the like. Of these, silicon nitride is most preferred because it has a high tolerance to chemicals used in device fabrication processes and also because the substrate costs are low. As used herein, "composed primarily of" means that silicon nitride, aluminum nitride or sialon is the primary ingredient, with secondary ingredients such as sintering aids also being included. Silicon nitride, aluminum nitride or sialon preferably accounts for at least 50 wt %, more preferably at least 80 wt %, and most preferably at least 90 wt %, of the overall ingredients.

It is preferable to set the thickness of the substrate to from 100 to 2,000 μm, and especially from 200 to 1,000 μm.

The sintered body sometimes includes a large amount of metal elements such as iron and aluminum, especially aluminum. These may exert an adverse influence by dissolving out or diffusing, etc. in device fabrication processes.

When the impurities concentration within the substrate, as determined by inductively coupled plasma mass spectrometry (ICP-MS), is not more than $1 \times 10^{17}$ atoms/$cm^3$ for iron and not more than $1 \times 10^{17}$ atoms/$cm^3$ for aluminum, a single-crystal semiconductor film can be formed directly on the surface of the substrate. However, at an iron concentration greater than the above but not more than $1 \times 10^{20}$ atoms/$cm^3$ and at an aluminum concentration greater than the above but not more than $1 \times 10^{20}$ atoms/$cm^3$, in order to prevent these impurities from dissolving out, it is preferable to cover the entire substrate with a silicon coating made of polycrystalline silicon or amorphous silicon. Of course, it is recommended that such a silicon coating be formed even in cases where the iron concentration is not more than $1 \times 10^{17}$ atoms/$cm^3$ and the aluminum concentration is not more than $1 \times 10^{17}$ atoms/$cm^3$. By providing a device-forming single-crystal semiconductor film, and specifically a single-crystal silicon film, over this intervening silicon coating, the desired composite substrate can be obtained. The silicon coating is preferably provided not only on the front surface of the substrate, but also on the back surface and the sidewalls so as to cover the entire substrate.

The object of the silicon coating is to prevent metallic impurities within the substrate from dissolving out or diffusing. This silicon coating must have a high purity. In order to achieve this, it is preferable to use a sputtering, electron-beam vapor deposition, chemical vapor deposition or epitaxial growth process as the means for providing the silicon coating. By using such means, the respective concentrations of aluminum and iron within the silicon coating film can be set to not more than the concentration within the sintered body, typically not more than $1 \times 10^{17}$ atoms/$cm^3$, preferably not more than $1 \times 10^{16}$ atoms/$cm^3$, and more preferably not more than $1 \times 10^{15}$ atoms/$cm^3$, enabling contamination by metallic impurities from the substrate to be suppressed. Because the polycrystalline silicon or amorphous silicon making up the silicon coating is a common and frequently used film, it can be inexpensively and easily formed.

A silicon coating enables good adhesion between the single-crystal semiconductor thin-film and the substrate to be easily obtained. Also, in cases where the subsequently described intermediate insulating layer is provided, good adhesion between the single-crystal semiconductor thin-film and the substrate is more easily obtained with such an intermediate insulating layer therebetween.

The silicon coating has a thickness of preferably from 0.01 to 50 μm, and especially from 0.1 to 20 μm. At a thickness of less than 0.01 μm, contamination by metallic impurities from the substrate may be difficult to suppress. On the other hand, a thickness of more than 50 μm may be undesirable in terms of cost.

It is desirable for the single-crystal semiconductor thin-film formed over the silicon coating to be a single-crystal silicon film because the device can be formed by a CMOS step using an ordinary bulk silicon substrate. Also, it is preferable for the thickness of the single-crystal semiconductor thin-film to be set to generally from 0.01 to 100 μm, and especially from 0.05 to 1 μm. Methods of forming the single-crystal semiconductor thin-film in this case are exemplified by the method of, as in the smart-cut layer transfer process, laminating a single-crystal semiconductor substrate that has been ion-implanted with hydrogen or noble gas ions, followed by peeling from the ion-implanted layer and transfer (this method is referred here as the "lamination method"), and by a method in which a semiconductor layer of silicon, SOI or the like is bonded and subsequently thinned by mechanical and/or chemical means.

Figure 2:
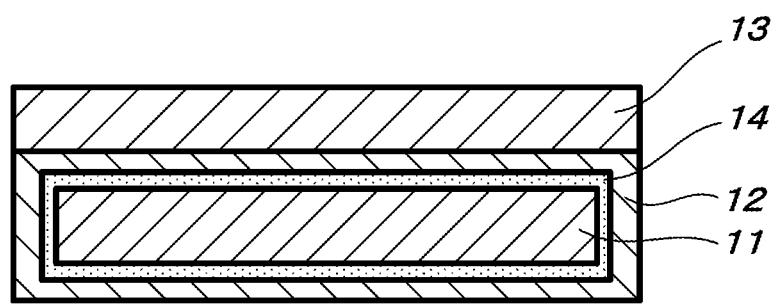
FIG. 2 is a schematic cross-sectional diagram showing another example of the construction of the composite substrate according to the invention.

Also, as shown in FIG. 2, when the above inorganic insulating sintered-body substrate 11 is covered with silicon nitride formed by chemical vapor deposition and a silicon coating 12 is provided thereon, contamination by metallic impurities can be suppressed even further.

The thickness of this silicon nitride coating 14 is preferably from 0.01 to 50 um, and especially from 0.1 to 20 μm.

Figure 3:
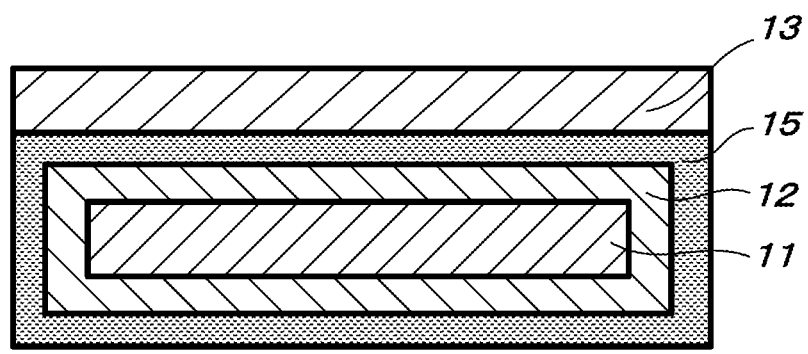
FIG. 3 is a schematic cross-sectional diagram showing another example of the construction of the composite substrate according to the invention.
Figure 4:
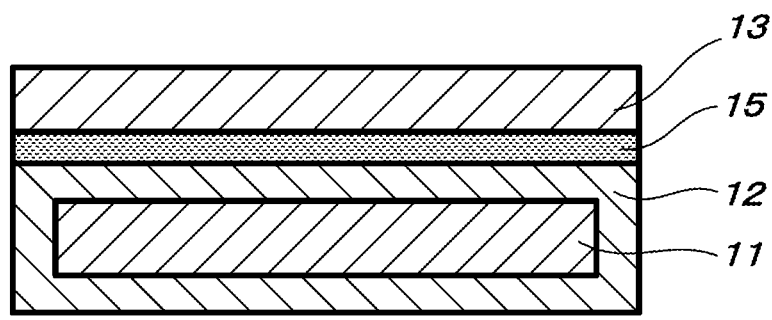
FIG. 4 is a schematic cross-sectional diagram showing another example of the construction of the composite substrate according to the invention.

In addition, as shown in FIGS. 3 and 4, it is even more preferable to provide, between the silicon coating 12 and the single-crystal semiconductor thin-film (13), at least one intermediate insulating layer 15 made of a material selected from the group consisting of silicon oxide, silicon nitride, aluminum nitride and sialon because doing so insulates between the silicon coating 12 and the single-crystal semiconductor thin-film 13 and thus improves the characteristics of the fabricated device. It is preferable to use sputtering, electron-beam vapor deposition or chemical vapor deposition as the means of providing the intermediate insulating layer 15. The thickness of this intermediate insulating layer 15 is preferably set to from 0.01 to 50 μm, and especially from 0.1 to 20 μm.

The procedure for manufacturing this composite substrate may involve forming the intermediate insulating layer 15 on the silicon coating 12, then forming a single-crystal semiconductor thin-film 13 by the lamination method described above. At this time, as shown in FIG. 3, the entire silicon coating 12 that covers the entire surface of the substrate may be additionally covered with the intermediate insulating layer 15. Alternatively, another procedure for manufacturing the composite substrate may involve forming this intermediate insulating layer 15 on the surface of a single-crystal semiconductor substrate in the lamination method, carrying out ion implantation, and subsequently carrying out lamination, peeling from the ion-implanted layer and transfer such that the intermediate insulating layer 15 adjoins the silicon coating 12. When this is done, as shown in FIG. 4, the intermediate insulating layer 15 is present as an intervening layer between the silicon coating 12 and the single-crystal semiconductor thin-film 13.

The composite substrate of the invention may be used primarily in, for example, power devices that generate a lot of heat and RF devices that use high frequencies.

EXAMPLES

The invention is illustrated more fully below by way of Working Examples and Comparative Examples, although these Examples are not intended to limit the invention.

Working Example 1

FIG. 1 shows the construction of the composite substrate fabricated in this Example.

First, a $Si_3N_4$ sintered body having a diameter of 200 mm and a thickness of 725 μm was fabricated as inorganic insulating sintered-body substrate 11. The volume resistivity of this substrate, as measured by the four-point probe method, was $1\times10^{14}$ Ω·cm. The thermal conductivity of the substrate, as measured by laser flash analysis, was 15 W/m·k.

A polycrystalline silicon film was formed as the silicon coating 12 over the entire surface of the substrate 11 to a thickness of 2 μm by chemical vapor deposition (CVD). The concentration of metallic impurities contained within this silicon coating 12 was determined by immersing the entire substrate 11 on which the silicon coating 12 had been formed in an aqueous solution of HF, dissolving the native oxide film on the silicon coating 12 in the aqueous HF solution, and carrying out ICM-MS analysis. As a result, iron was the most abundant of the metallic impurities within the silicon coating, being present in a concentration of $1.2\times10^{15}$ atoms/$cm^3$. The next most abundant metallic impurity was aluminum, for which the concentration was $1.0\times10^{14}$ atoms/$cm^3$. Other metallic impurities were below the limit of detection ($7\times10^{13}$ atoms/$cm^3$) and thus at concentrations which pose no problem in device fabrication processes.

Next, a single-crystal silicon thin-film having a thickness of 0.3 μm was created by the lamination process as single-crystal semiconductor thin-film 13 on the silicon coating 12 on one side of the substrate.

By thus using an inexpensive sintered-body substrate having a high thermal conductivity, it was possible to fabricate a composite substrate for which there is little risk of metal contamination.

Working Example 2

FIG. 1 shows the construction of the composite substrate fabricated in this Example.

First, a $Si_3N_4$ sintered body having a diameter of 150 mm and a thickness of 625 μm was fabricated as inorganic insulating sintered-body substrate 11. The volume resistivity of this substrate, as measured by the four-point probe method, was $1\times10^{14}$ Ω·cm. The thermal conductivity of the substrate, as measured by laser flash analysis, was 50 W/m·k.

An amorphous silicon film was formed as the silicon coating 12 over the entire surface of the substrate 11 to a thickness of 1 μm by sputtering. The concentration of metallic impurities contained within this silicon coating 12 was determined by immersing the entire substrate 11 on which the silicon coating 12 had been formed in an aqueous solution of HF, dissolving the native oxide film on the silicon coating 12 in the aqueous HF solution, and carrying out ICM-MS analysis. As a result, iron was the most abundant of the metallic impurities within the silicon coating, being present in a concentration of $1.5\times10^{15}$ atoms/$cm^3$. The next most abundant metallic impurity was aluminum, for which the concentration was $1.5\times10^{14}$ atoms/$cm^3$. Other metallic impurities were below the limit of detection ($7\times10^{13}$ atoms/$cm^3$) and thus at concentrations which pose no problem in device fabrication processes.

Next, a single-crystal silicon thin-film having a thickness of 0.3 μm was created by the lamination process as single-crystal semiconductor thin-film 13 on the silicon coating 12 on one side of the substrate.

By thus using an inexpensive sintered-body substrate having a high thermal conductivity, it was possible to fabricate a composite substrate for which there is little risk of metal contamination.

Working Example 3

The composite substrate fabricated in this Example is one where, for the composite substrate shown in FIG. 1, an intermediate insulating layer 15 was additionally formed between the silicon coating 12 and the single-crystal semiconductor thin-film 13, as shown in FIG. 3.

First, a $Si_3N_4$ sintered body having a diameter of 200 mm and a thickness of 725 μm was fabricated as inorganic insulating sintered-body substrate 11. The volume resistivity of this substrate, as measured by the four-point probe method, was $1\times10^{14}$ Ω·cm. The thermal conductivity of the substrate, as measured by laser flash analysis, was 15 W/m·k.

An amorphous silicon film was formed as the silicon coating 12 over the entire surface of the substrate 11 to a thickness of 1 μm by sputtering. The concentration of metallic impurities contained within this silicon coating 12 was determined by immersing the entire substrate 11 on which the silicon coating 12 had been formed in an aqueous solution of HF, dissolving the native oxide film on the silicon coating 12 in the aqueous HF solution, and carrying out ICM-MS analysis. As a result, iron was the most abundant of the metallic impurities within the silicon coating, being present in a concentration of $1.5\times10^{15}$ atoms/cm$^3$. The next most abundant metallic impurity was aluminum, for which the concentration was $1.5\times10^{14}$ atoms/cm$^3$. Other metallic impurities were below the limit of detection ($7\times10^{13}$ atoms/cm$^3$) and thus at concentrations which pose no problem in device fabrication processes.

Next, a silicon oxide film was formed by chemical vapor deposition (CVD) to a thickness of 2 μm as an intermediate insulating layer 15 on the silicon coating 12 over the entire surface of the substrate. The concentration of metallic impurities contained in this silicon oxide film was determined by dissolving this film in an aqueous HF solution and carrying out ICM-MS analysis. As a result, metallic impurities within the film were below the limit of detection ($7\times10^{13}$ atoms/cm$^3$) and thus at concentrations which pose no problem in device fabrication processes.

Finally, a single-crystal silicon thin-film having a thickness of 0.3 μm was created by the lamination process as single-crystal semiconductor thin-film 13 on the intermediate insulating layer 15 on one side of the substrate.

By thus using an inexpensive sintered-body substrate having a high thermal conductivity, it was possible to fabricate a composite substrate for which there is little risk of metal contamination.

Comparative Example 1

A $Si_3N_4$ sintered body having the same volume resistivity and thermal conductivity as in Working Example 1 was fabricated. This substrate was immersed in an aqueous HF solution and dissolved, and the concentration of metallic impurities was determined by ICP-MS analysis, whereupon the concentration of iron was $1\times10^{19}$ atoms/cm$^3$ and the concentration of aluminum was $5\times10^{18}$ atoms/cm$^3$. These concentrations were strikingly high compared with the metallic impurity concentrations in the silicon coating in Working Example 1. Although the volume resistivity and the thermal conductivity are fine, such concentration levels may lead to contamination problem of the production line when using the substrate in device fabrication processes. Hence, the substrate could not be used in this form.

Although some preferred embodiments of the invention have been described above in conjunction with the diagram, the invention is not limited to the embodiments shown in the diagram, various modifications such as other embodiments, additions, deletions and substitutions being possible within a range conceivable by those skilled in the art, insofar as all such variations exhibit the operation and advantageous effects of the invention and are encompassed within the scope of the invention.

REFERENCE SIGNS LIST

11 Inorganic insulating sintered-body substrate
12 Silicon coating
13 Single-crystal semiconductor thin-film
14 Silicon nitride coating
15 Intermediate insulating layer

The invention claimed is:

1. A composite substrate comprising an inorganic insulating sintered-body substrate having a thermal conductivity of at least 5 W/m·k and a volume resistivity of at least $1\times10^8$ Ω·cm, and a single-crystal semiconductor thin-film provided on at least a front surface of the inorganic insulating sintered-body substrate, the composite substrate being characterized by having a silicon coating made of polycrystalline silicon or amorphous silicon provided between the inorganic insulating sintered-body substrate and the single-crystal semiconductor thin-film.

2. The composite substrate of claim 1 which is characterized in that the silicon coating covers all of the inorganic insulating sintered-body substrate.

3. The composite substrate of claim 1 which is characterized in that the silicon coating is a high-purity silicon layer formed by sputtering, electron-beam vapor deposition, chemical vapor deposition or epitaxial growth.

4. The composite substrate of claim 1 which is characterized in that the inorganic insulating sintered-body substrate is composed primarily of silicon nitride, aluminum nitride or sialon.

5. The composite substrate of claim 1 which is characterized in that the single-crystal semiconductor thin-film is single-crystal silicon.

6. The composite substrate of claim 1 which is characterized by further comprising, between the inorganic insulating sintered-body substrate and the silicon coating, a silicon nitride coating formed by chemical vapor deposition.

7. The composite substrate of claim 1 which is characterized by further comprising, between the silicon coating and the single-crystal semiconductor thin-film, at least one intermediate insulating layer made of a material selected from the group consisting of silicon oxide, silicon nitride, aluminum nitride and sialon.

* * * * *